(12) United States Patent
Wang et al.

(10) Patent No.: US 8,957,487 B2
(45) Date of Patent: Feb. 17, 2015

(54) TUNNELING MAGNETO-RESISTOR REFERENCE UNIT AND MAGNETIC FIELD SENSING CIRCUIT USING THE SAME

(75) Inventors: Yung-Hung Wang, Hsinchu County (TW); Sheng-Huang Huang, Tainan (TW); Kuei-Hung Shen, Hsinchu (TW); Keng-Ming Kuo, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 109 days.

(21) Appl. No.: 13/600,795

(22) Filed: Aug. 31, 2012

(65) Prior Publication Data

US 2013/0168788 A1   Jul. 4, 2013

Related U.S. Application Data

(60) Provisional application No. 61/583,100, filed on Jan. 4, 2012.

(51) Int. Cl.
   *H01L 29/82*   (2006.01)
   *G11C 11/14*   (2006.01)

(52) U.S. Cl.
   USPC ............ 257/421; 257/427; 365/171; 365/173

(58) Field of Classification Search
   CPC ...................................................... G01R 33/098
   USPC ................... 257/421, 427; 365/171, 158, 173
   See application file for complete search history.

(56) References Cited

U.S. PATENT DOCUMENTS

| | | |
|---|---|---|
| 5,650,958 A | 7/1997 | Gallagher et al. |
| 5,801,984 A | 9/1998 | Parkin |
| 5,986,925 A | 11/1999 | Naji et al. |
| 6,127,045 A | 10/2000 | Gill |
| 2002/0154540 A1 | 10/2002 | Sekiguchi et al. |
| 2006/0039183 A1 | 2/2006 | Lin et al. |

(Continued)

FOREIGN PATENT DOCUMENTS

| | | |
|---|---|---|
| CN | 1898574 A | 1/2007 |
| CN | 101072022 A | 11/2007 |

(Continued)

OTHER PUBLICATIONS

Fujiwara et al., "Fabrication of magnetic tunnel junctions with a synthetic ferromagnetic free layer for magnetic field sensor applications", Japanese Journal of Applied Physics 50, Jan. 20, 2011, pp. 013001_1-013301_3.

(Continued)

*Primary Examiner* — Jose R Diaz
(74) *Attorney, Agent, or Firm* — Birch, Stewart, Kolasch & Birch, LLP

(57) ABSTRACT

A tunneling magneto-resistor reference unit for sensing a magnetic field includes a first MTJ (magnetic tunneling junction) device and a second MTJ device connected in parallel. The first MTJ device has a first pinned layer having a first pinned magnetization at a pinned direction, and a first free layer having a first free magnetization parallel to the pinned direction in a zero magnetic field. The second MTJ device has a second pinned layer having a second pinned magnetization at the pinned direction, and a second free layer having a second free magnetization anti-parallel to the pinned direction in a zero magnetic field. Major axes of the first and second MTJ devices have an angle of 45 degrees to a direction of an external magnetic field when sensed.

10 Claims, 7 Drawing Sheets

(56) References Cited

U.S. PATENT DOCUMENTS

| | | |
|---|---|---|
| 2007/0064351 A1 | 3/2007 | Wang et al. |
| 2008/0225585 A1 | 9/2008 | Ranjan et al. |
| 2008/0247098 A1* | 10/2008 | Deak .................... 360/328 |
| 2009/0027048 A1 | 1/2009 | Sato et al. |
| 2009/0115405 A1 | 5/2009 | Guo et al. |
| 2009/0243607 A1 | 10/2009 | Mather et al. |
| 2010/0276389 A1 | 11/2010 | Mather et al. |
| 2011/0074406 A1 | 3/2011 | Mather et al. |
| 2011/0141796 A1 | 6/2011 | Lee et al. |
| 2012/0068698 A1* | 3/2012 | Chen et al. ............ 324/252 |
| 2013/0201757 A1 | 8/2013 | Li et al. |

FOREIGN PATENT DOCUMENTS

| | | |
|---|---|---|
| CN | 101828124 A | 9/2010 |
| TW | 200741799 | 7/2006 |
| TW | 201142336 A | 12/2011 |
| WO | WO 2012/142915 A1 | 10/2012 |

OTHER PUBLICATIONS

Lohndorf et al., "Strain Sensors Based on Magnetostrictive GMR/TMR Structures", IEEE Transactions on Magnetics, vol. 38, No. 5, Sep. 2002, pp. 2826-2828.

Persson et al., "Etch-stop technique for patterning of tunnel junctions for magnetic a field sensor", Journal of Micromechanics and Microengineering, 2011, pp. 1-8.

Wang et al., "70% TMR at Room Temperature for SDT Sandwich Junctions with CoFeB as Free and Reference Layers", IEEE Transactions on Magnetics, vol. 40, No. 4, Jul. 2004, pp. 2269-2271.

Taiwan Office Action dated Jun. 3, 2014. pp. 1-5.

* cited by examiner

US 8,957,487 B2

TUNNELING MAGNETO-RESISTOR REFERENCE UNIT AND MAGNETIC FIELD SENSING CIRCUIT USING THE SAME

CROSS REFERENCE TO RELATED APPLICATIONS

The present application is based on, and claims priority from, U.S. Provisional Application Ser. No. 61/583,100, filed Jan. 4, 2012, the disclosure of which is hereby incorporated by reference herein in its entirety.

TECHNICAL FIELD

The disclosure relates to magnetic field sensing technology, and particularly relates to tunneling magneto-resistor reference unit and magnetic field sensing circuit using the same.

BACKGROUND

As demand for consumer electronic products such as smart phones grows vigorously, electronic compasses utilizing magnetic field sensing technology have eagerly been required. Hall sensors and ARM (anisotropic magneto-resistor) sensors may be the most popular magnetic field sensors, but both suffer from low sensitivity to magnetic fields and consume a large device area. Using a tunneling magneto-resistor (TMR) as magnetic field sensor has the benefits of higher sensitivity and lower device area than the Hall sensor and ARM sensor. However, the TMR merely performs single-axis sensing for magnetic fields and lacks linearity to respond to magnetic fields. Thus, it is not easily applied to electronic compasses.

A typical TMR for a magnetic field sensor 100 is shown in FIGS. 1A to 1B. The TMR 100 includes a bottom plate of conducting metal, servings as a bottom electrode 102 formed on a substrate 90, an MTJ (Magnetic Tunneling Junction) device 110 formed on the bottom electrode 102 and a top plate of conducting material, serving as a top electrode 106 formed on the MTJ device 110. From the structure pattern of the MTJ device, one can define a cross having an intersection at a center, wherein the longer length is called a major axis 101 and the shorter length is called a minor axis 103. A line called an easy-axis 180 is collinear with a major axis 101. The MTJ device 110 includes a pinned layer 112, a tunneling layer 115 and a free layer 116, in which the MTJ device 110 is sandwiched between the bottom electrode 102 and the top electrode 106, for example. The pinned layer 112 is made of magnetic material formed on the bottom electrode 102 and has a first pinned magnetization 114, parallel to a pinned direction. The tunneling layer 115 of non-magnetic material is formed on the pinned layer 112. The free layer 116 of magnetic material is formed on the tunneling layer 115 and has a first free magnetization 118, initially parallel to the easy axis 180.

Before or after the MTJ device is formed (i.e. magnetic thin film stacking and pattern etching), the pinned direction is set by applying a field thereto during an anneal process. After the anneal process, the pinned direction will be parallel to the direction of the applied field, and the free magnetization tends to be parallel to the easy-axis due to the shape anisotropy. Therefore, the magnetic field sensing direction of the TMR is perpendicularly to the easy-axis 180. Additionally, the magnetic film typically is material of horizontal polarization and suffers from a very strong demagnetization field, which confines the activities of magnetizations of free and pinned layers, all of which are in-plane of the magnetic film. Namely, it is easy to rotate the free magnetization on the horizontal plane but the free magnetization hardly stands perpendicular to the plane of the magnetic film. Consequently, the typical structure of the TMR is only available for a single axis magnetic field sensor.

FIGS. 2A~2B are drawings, schematically illustrating the cross-sectional view and the top view along the line at the easy-axis of a mutual supplement tunneling magneto-resistor, called a MS-TMR, having good linearity to respond to magnetic fields. In FIGS. 2A~2B, the MS-TMR 150 includes a bottom electrode 102 of conducting material on a substrate 90 and a top electrode 106 of conducting material and first and second MTJ (Magnetic Tunneling Junction) devices 110a, 110b, disposed between the bottom electrode 102 and the top electrode 106. The first and second MTJ devices 110a, 110b have a collinear easy-axis 180. The first MTJ device 110a includes a pinned layer 112a of magnetic material formed on the bottom electrode 102 and has a first pinned magnetization 114a parallel to a pinned direction 140 which has an angle of 45 degrees to the easy-axis 180. A first tunneling layer 115a of non-magnetic material is formed on the first pinned layer 112a. A first free layer 116a of magnetic material is formed on the first tunneling layer 115a and has a first free magnetization 118a initially parallel to the easy-axis 180. The top electrode 106 connects to the first free layer 116a.

The second MTJ device 110b has the same structure pattern and film stack as the first MTJ devices 110a. The second MTJ device 110b includes a second pinned layer 112b of magnetic material formed on the bottom electrode 102 and has a second pinned magnetization 114b also parallel to the same pinned direction 140. A second tunneling layer 115b of non-magnetic material is formed on the second pinned layer 112b. A second free layer 116b of magnetic material is formed on the second tunneling layer 115b and has a second free magnetization 118b initially parallel to the easy-axis 180 but anti-parallel to the first free magnetization 118a. The top electrode 106 connects to the second free layer 116b.

A metal line 108 passes across the first and the second MTJ devices 110a, 110b and a set current $I_{SET}$ can be applied to generate a first ampere field around the metal line. Here, the metal line 108 passes over the first and the second MTJ devices, for example; but it also can pass below the first and the second MTJ devices. The first ampere field applied on the first and second MTJ devices 110a and 110b respectively, are parallel to the easy-axis 180 but directionally opposite, thus the first and second free magnetizations 118a, 118b are set to be anti-parallel.

A magnetic field sensing circuit may comprise a TMR sensing unit and a TMR reference unit. The TMR sensing unit and TMR reference unit are of the same structure as depicted in FIGS. 2A and 2B. When the magnetic field sensing circuit activates to sense an external magnetic field, another ampere field is first applied to the TMR reference unit by applying a tuning current in the metal line above or below the first and second MTJ device of the TMR reference unit. The ampere field makes the free magnetizations of the MTJ devices in the TMR reference unit fixed to the easy-axis, and equivalently the TMR reference unit is not influenced by the external magnetic field to be sensed, thereby fixing the conductance (or resistance) of the TMR reference unit. Large tuning current is required to generate the magnetic field for operation of the TMR reference unit, and therefore additional power consumption is inevitable. A novel TMR reference unit operating without additional power consumption is desired.

SUMMARY

In one exemplary embodiment of the disclosure, a tunneling magneto-resistor reference unit for sensing a magnetic field comprises: a first MTJ (magnetic tunneling junction) device and a second MTJ device connected in parallel. The first MTJ device comprises: a first pinned layer having a first pinned magnetization at a pinned direction; and a first free layer having a first free magnetization parallel to the pinned direction, in zero magnetic fields. The second MTJ device comprises: a second pinned layer having a second pinned magnetization at the pinned direction; and a second free layer having a second free magnetization anti-parallel to the pinned direction in a zero magnetic field. Major axes of the first and second MTJ devices have an angle of 45 degrees to a direction of the external magnetic field when sensed.

In another exemplary embodiment of the disclosure, the TMR reference unit of the disclosure is operable to act as a zero-field reference having a first conductance not responding to the external magnetic field, to construct a magnetic field sensing circuit. The magnetic field sensing circuit, comprises: the TMR reference unit; a magnetic field sensing unit comprising a third MTJ device and a fourth MTJ device connected in parallel, having a second conductance responding to the external magnetic field, wherein a sensing current flows in the magnetic field sensing unit responding to the external magnetic field; a current mirror outputting a first current and a second current to the TMR reference unit and the magnetic field sensing unit, wherein the first current is equal to the second current; and a signal transfer amplifying unit connected to the magnetic field sensing unit, generating a transfer current in response to the conductance variation of the magnetic field sensing unit when sensing the external magnetic field. The transfer current is equal to the sensing current subtracted by the second current.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF DISCLOSED EMBODIMENTS

The following description is of the best-contemplated mode of carrying out the disclosure. This description is made for the purpose of illustrating the general principles of the disclosure and should not be taken in a limiting sense. The scope of the invention is best determined by reference to the appended claims.

Figure 3A:
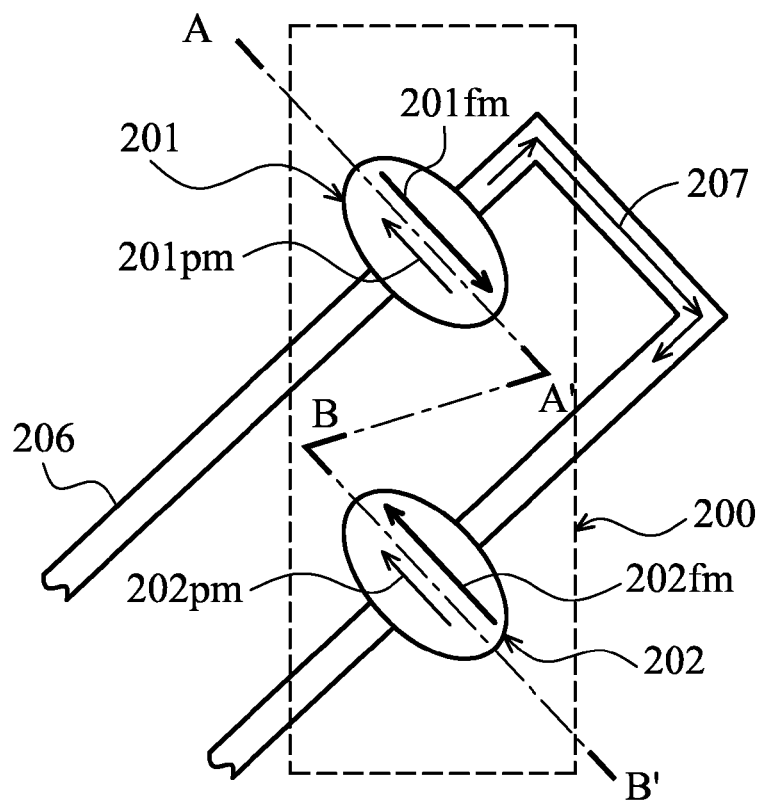
FIGS. 3A~3B are drawings, schematically illustrating a top view and a cross-sectional view of a TMR reference unit according to an embodiment of the disclosure.
Figure 3B:
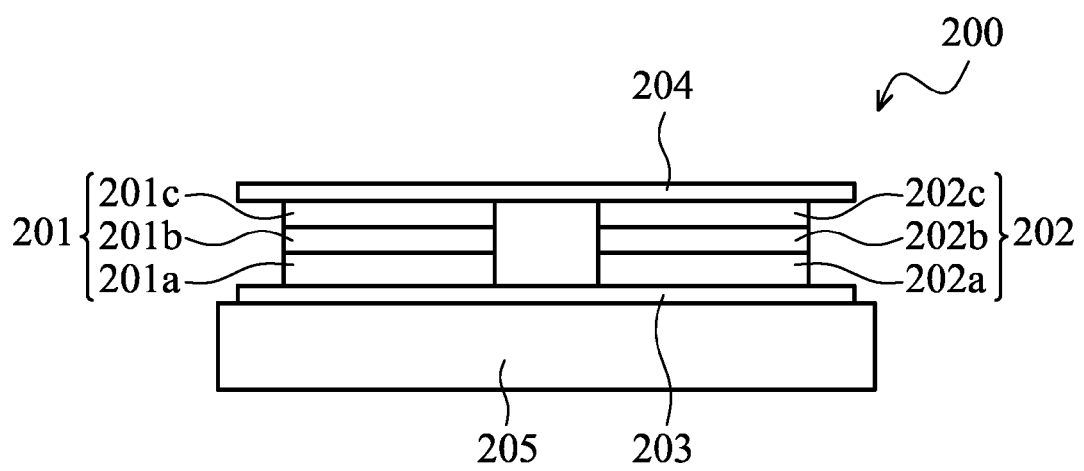

Following description discloses tunneling magneto-resistor reference units operate as zero-filed reference units without additional bias current or magnetic shield, and magnetic field sensing circuits using the same. FIGS. 3A and 3B are drawings, schematically illustrating a top view and a cross-sectional view along the lines A-A' and B-B' at easy-axes of a TMR (tunneling magneto-resistor) reference unit according to an embodiment of the disclosure.

In FIGS. 3A and 3B, the TMR reference unit 200 has a first MTJ (Magnetic Tunneling Junction) device 201 and a second MTJ device 202. A bottom electrode 203 is formed on a substrate 205 and the first MJT device 201 and the second MJT device 202 are formed thereon. A top electrode 204 is formed on the first and second MTJ devices 201 and 202, thereby connecting the first and second MTJ devices 201 and 202 in parallel.

The first MTJ device 201 comprises a first pinned layer 201a of magnetic material formed on the bottom electrode 203 and has a first pinned magnetization 201pm. A first tunneling layer 201b of non-magnetic material is formed on the first pinned layer 201a. A first free layer 201c of magnetic material is formed on the first tunneling layer 201b and has a first free magnetization 201fm. The top electrode 204 connects to the first free layer 201c.

The second MTJ device 202 comprises a second pinned layer 202a of magnetic material formed on the bottom electrode 203 and has a second pinned magnetization 202pm. A second tunneling layer 202b of non-magnetic material is formed on the second pinned layer 202a. A second free layer 202c of magnetic material is formed on the second tunneling layer 202b and has a second free magnetization 202fm. The top electrode 204 connects to the second free layer 202c.

It is noted that the first and second MTJ devices 201 and 202 are simultaneously made by the same fabrication process, and the major axes of the first and second MTJ devices 201 and 202 are in parallel. The first and second pinned layers 201a and 202a of the first and second MTJ devices 201 and 202 are of the same magnetization direction. Thus, the first and second pinned magnetizations 201pm and 202pm are along the same direction, along the major axis (lines A-A' and B-B').

The magnetization directions of the free layers 201c and 202c are set by using an ampere field generated by providing a current through the conduction line 206 disposed below (or above) the first and second MTJ devices 201 and 202, for example. Numeral 207 indicates the current direction in the conduction line 206 for setting the initial direction of free magnetizations. After applying the ampere field, the first free magnetization 201fm is anti-parallel to the first pinned magnetization 201pm and the second free magnetization 202fm is parallel to the second pinned magnetization 202pm, as shown in FIG. 3A. When an external magnetic field is applied to the two MTJ devices of the TMR reference unit 200, the conductance (resistance) of one of the MTJ devices increases and the other decreases. Therefore, the total conductance of the TMR reference 200 will not change in response to the external magnetic field, thus acting as a zero-field reference unit.

Figure 4A:
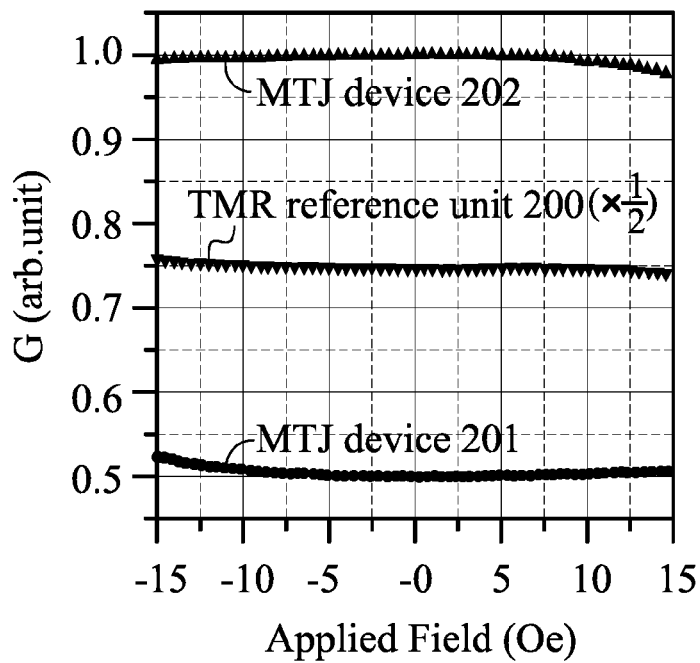
FIGS. 4A~4B show the relationship between the conductance (G) of the TMR reference unit 200 with respect to the applied magnetic field along the X-axis and Y-axis, based on a micromagnetic simulation.
Figure 4B:
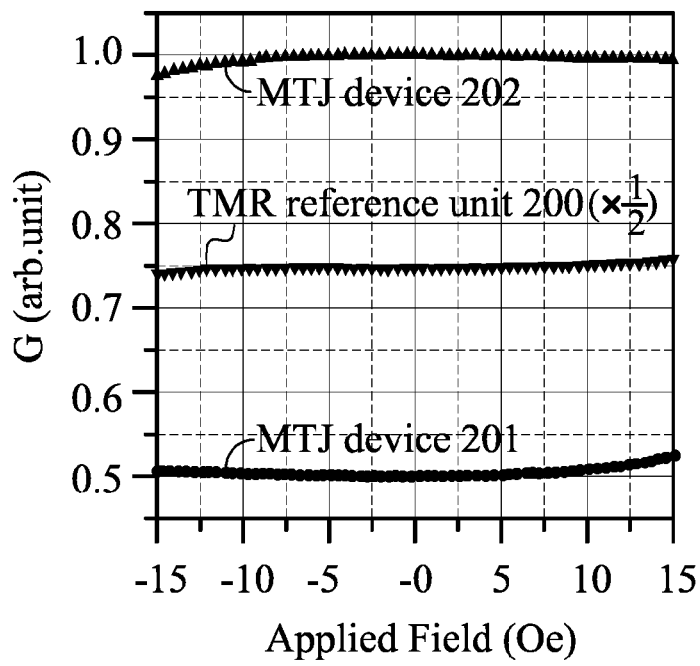

FIGS. 4A and 4B show the variance of the conductance (G; (arb. Unit)) of the TMR reference unit 200 with respect to the applied magnetic field along the X-axis and Y-axis, based on a micromagnetic simulation. In view of FIGS. 4A and 4B, the conductance of the TMR reference unit 200 is substantially fixed when the applied magnetic field is in the rage of −15~+15 Oe, and the TMR reference unit 200 has better performance for serving as a zero-field reference unit than the first or second MJT device (201 or 202) working alone.

Figure 5A:
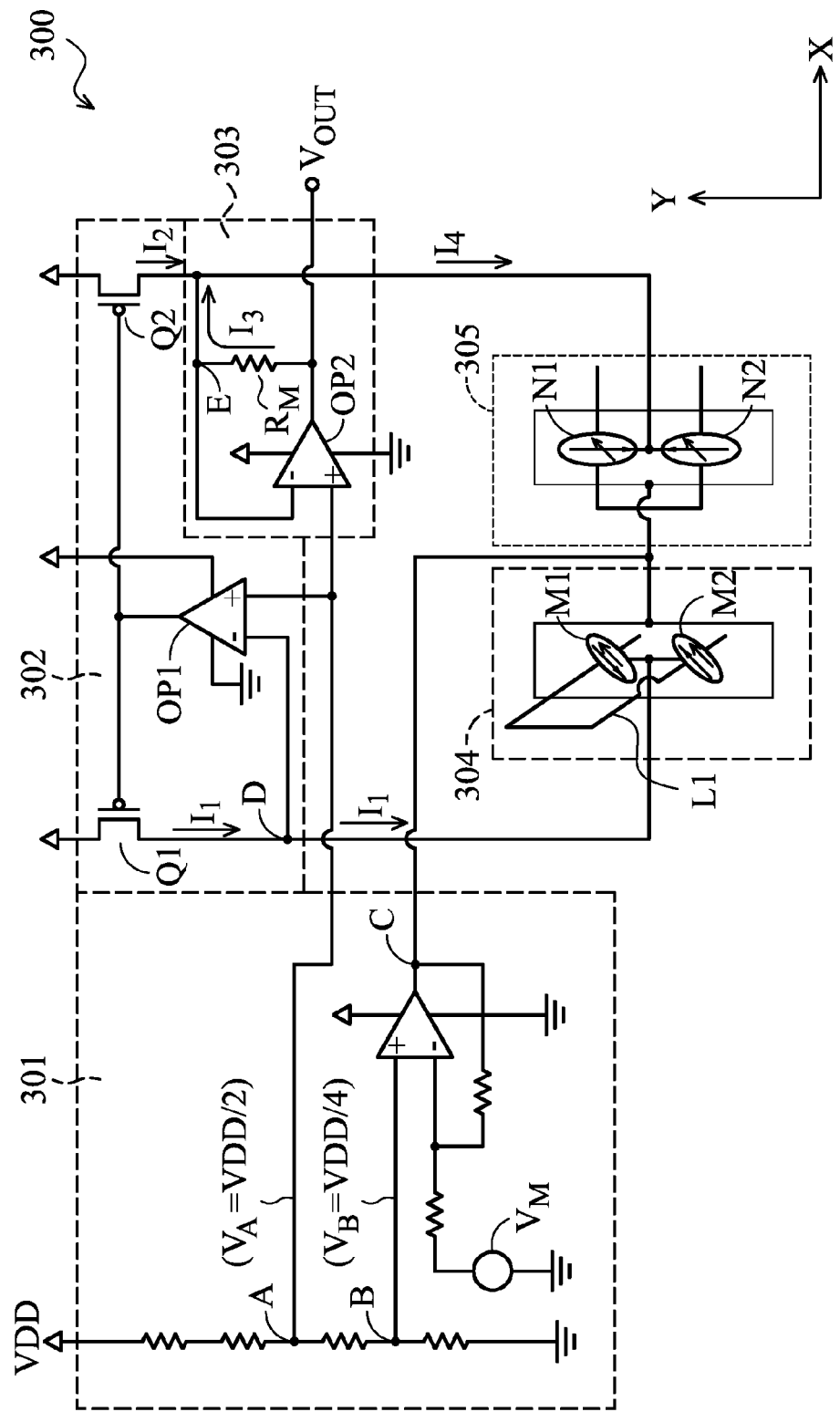
FIGS. 5A~5C schematically show magnetic field sensing circuits for transferring sensed magnetic fields along an X-axis, Y-axis and Z-axis into electronic signals respectively.
Figure 5B:
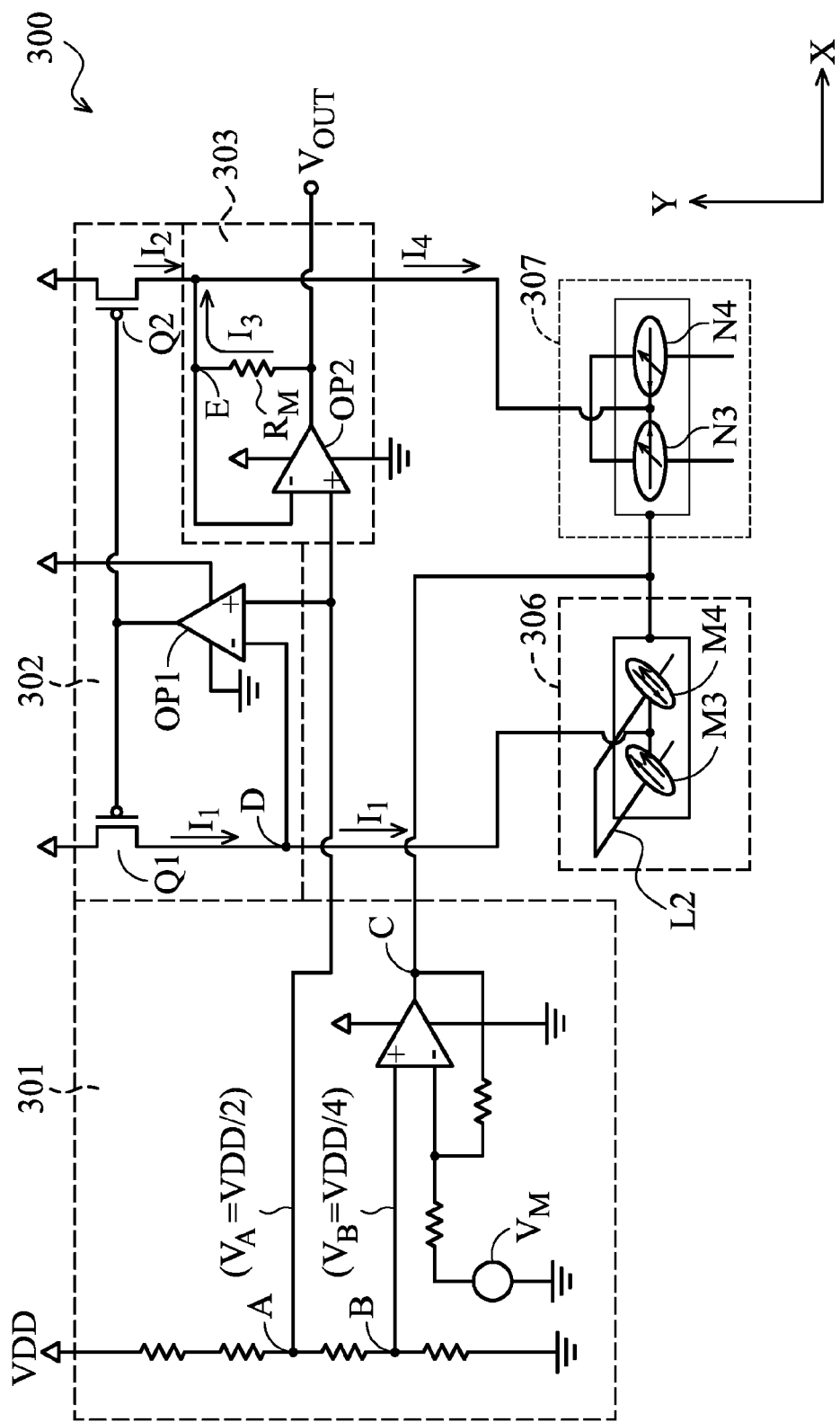
Figure 5C:
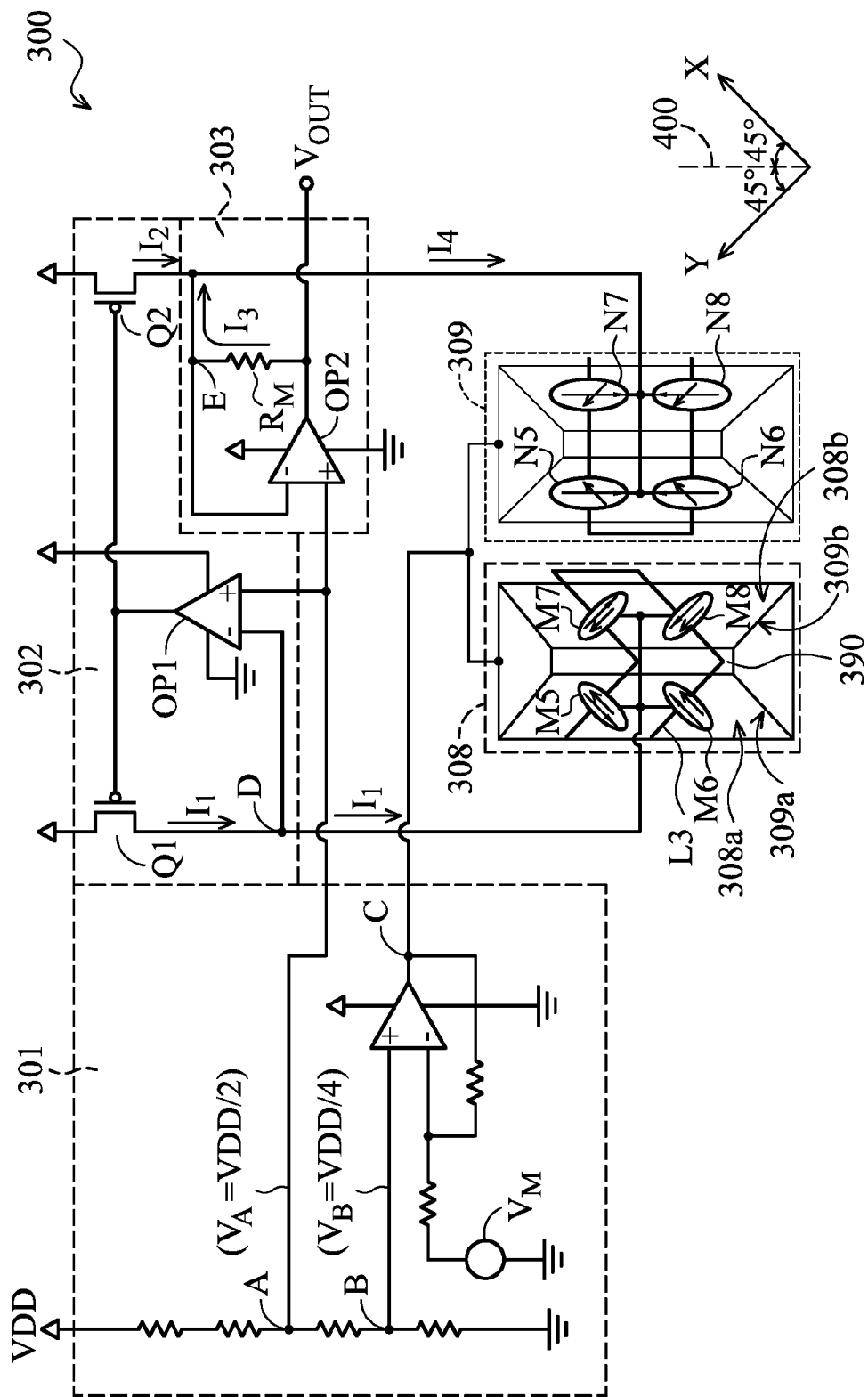

FIGS. 5A~5C schematically show magnetic field sensing circuits for transferring sensed magnetic fields along an X-axis, Y-axis and Z-axis into electronic signals respectively. In FIG. 5A, the magnetic field sensing circuits 300 comprise a bias voltage unit 301, a current mirror unit 302, a signal transfer amplifying unit 303, a TMR reference unit 304, and a magnetic field sensing unit. The TMR reference unit 304 in FIG. 5A has the same structure as the TMR reference unit 200 described in FIGS. 3A and 3B.

In FIG. 5A, the magnetic field sensing unit is an X-axis magnetic field sensing unit 305, and the bottom electrodes of the TMR reference unit 304 and the X-axis magnetic field sensing unit 305 are connected to the node C. The top electrode of the TMR reference unit 304 is connected to the node D and the top electrode of the X-axis magnetic field sensing unit 305 is connected to the node E. As can be understood, the TMR reference unit 304 and the X-axis magnetic field sensing unit 305 in this example are for sensing the x-directional of an external magnetic field. However, the magnetic field sensing circuit 300 is also able to sense a y-directional and z-directional of magnetic field, by replacing the X-axis magnetic field sensing unit 305 with the Y-axis magnetic field sensing unit 307 or the Z-axis magnetic field sensing unit 309, as depicted in FIGS. 5B and 5C.

The bias voltage unit 301 includes a voltage divider, a voltage subtraction circuit and a voltage source $V_M$. In this embodiment, the voltage divider comprises four resistors of same resistance connected in series, for example. The voltage divider generates voltages $V_A$ (=VDD/2), and $V_B$ (=VDD/4) at node A and node B, respectively. The voltage $V_C$ generated by the voltage subtraction circuit at node C is provided to the bottom electrodes of the TMR reference unit 304 and the X-axis magnetic field sensing unit 305.

The current mirror unit 302 includes a current mirror and a voltage clamper. The current mirror includes a first PMOS Q1 and a second PMOS Q2. The sources of the first PMOS Q1 and the second PMOS Q2 are connected to the VDD. The drain of the first PMOS Q1 is connected to the node D, the drain of the second PMOS Q2 is connected to the node E, the gate of the first PMOS Q1 is connected to the gate of the second PMOS Q2. The current mirror outputs two equal currents $I_1$ and $I_2$. The voltage clamper comprises an operational amplifier OP1, operating to make the voltage $V_D$ at the node D equal to the voltage $Y_E$ at the node E. The signal transfer amplifying unit 303 includes an operational amplifier OP2 having a negative input connected to the node E, a positive input connected to the node A and a resistor $R_M$ connected between the node E and the output of the operational amplifier OP2.

The two MTJ devices in the TMR reference unit 304 have anti-parallel free magnetizations, and the two MTJ devices in X-axis magnetic field sensing unit 305 also have anti-parallel free magnetizations. Therefore the TMR reference unit 304 and the X-axis magnetic field sensing unit 305 have the same conductance when no external magnetic field is applied thereto. The voltages $V_D$ and $V_E$ are clamped to be equal and thus the currents $I_1$ (=$I_2$) and $I_4$ (=$I_2$+$I_3$) are equal, wherein the current $I_3$ is zero and due to no external magnetic field. When an external magnetic field is applied to the magnetic field sensing circuit 300, the conductance of the X-axis magnetic field sensing unit 305 is changed in response to the external field, however that of the TMR reference unit 304 is not. Consequently, the current $I_4$ changes and is not equal to the current $I_1$. The variation of the current $I_4$ is provided by the current $I_3$ since the currents $I_1$ and $I_2$ do not change. Therefore, the current $I_3$ will not be zero and respond to the external magnetic field. The output voltage $V_{out}$ of the magnetic field sensing circuit 300 responds to the sensed external magnetic field.

In FIG. 5A, the X-axis magnetic field sensing unit 305 has the easy-axis 180 (shown in FIG. 2B) parallel to the Y-axis and the TMR reference unit 304 has the easy-axes (lines A-A' and B-B') which have angles of 45 degrees to the Y-axis. The X-axis magnetic field sensing unit 305 has two MTJ devices N1 and N2. The MTJ device N1 has a pinned magnetization with an angle of 45 degrees to the easy-axis, and a free magnetization parallel to the easy-axis. The MTJ device N2 has a pinned magnetization with an angle of 45 degrees to the easy-axis, and free magnetizations parallel to the easy-axis. The TMR reference unit 304 has a first MTJ device M1, a second MTJ device M2, and a conduction line L1 having two segments respectively disposed below (or above) and cross the first and second MTJ devices M1 and M2, wherein the pinned magnetizations of the first and second MTJ devices M1 and M2 are parallel to the easy-axes of the first and second MTJ devices M1 and M2. The free magnetization of the first MTJ device M1 is anti-parallel to the pinned magnetization of the first MTJ device M1, the free magnetization of the second MTJ device M2 is parallel to the pinned magnetization of the second MTJ device M2. The pinned magnetizations of MTJ devices M1 and M2 are parallel to the pinned magnetizations of MTJ devices N1 and N2 respectively. The free magnetizations of MTJ devices M1 and M2 are with an angle of 45 degrees to the free magnetizations of MTJ devices N1 and N2 respectively. The two segments of the conduction line L1 are perpendicular to the pinned magnetizations and the free magnetizations of the first and second MTJ devices M1 and M2. In FIG. 5B, the Y-axis magnetic field sensing unit 307 has the easy-axis 180 (shown in FIG. 2B) parallel to the X-axis and the TMR reference unit 306 has the easy-axes (lines A-A' and B-B') having angles of 45 degrees to the Y-axis. The Y-axis magnetic field sensing unit 307 has two MTJ devices N3 and N4. The MTJ device N3 has a pinned magnetization with an angle of 45 degrees to the easy-axis, and a free magnetization parallel to the easy-axis. The MTJ device N2 has a pinned magnetization with an angle of 45 degrees to the easy-axis, and free magnetizations parallel to the easy-axis. The TMR reference unit 306 has a third MTJ device M3, a fourth MTJ device M4, and a conduction line L2 having two segments respectively disposed below (or above) the third and fourth MTJ devices M3 and M4, wherein the pinned magnetizations of the third and fourth MTJ devices M3 and M4 are parallel to the easy-axes of the third and fourth MTJ devices M3 and M4. The free magnetization of the third MTJ device M3 is parallel to the pinned magnetization of the third MTJ device M3, the free magnetization of the fourth MTJ device M4 is anti-parallel to the pinned magnetization of the fourth MTJ device M4. The pinned magnetizations of MTJ devices M3 and M4 are parallel to the pinned magnetizations of MTJ devices N3 and N4 respectively. The free magnetizations of MTJ devices M3 and M4 are with an angle of 45 degrees to the free magnetizations of MTJ devices N3 and N4 respectively. The two segments of the conduction line L2 are perpendicular to the pinned magnetizations and the free magnetizations of the third and fourth MTJ devices M3 and M4. In FIG. 5C, an auxiliary axis 400 is illustrated, having an angle of 45 degrees to the X-axis or Y-axis on the X-Y plane. The Z-axis magnetic field sensing unit 309 has the easy-axis 180 (shown in FIG. 2B) parallel to the auxiliary axis 400, but is not limited thereto.

Figure 1A:
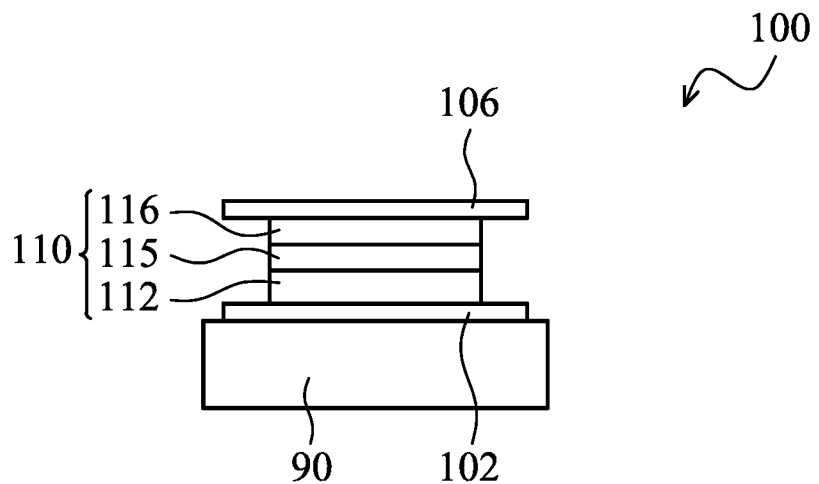
FIG. 1A schematically shows, from a cross-sectional view, a typical TMR for a magnetic field sensor.
Figure 1B:
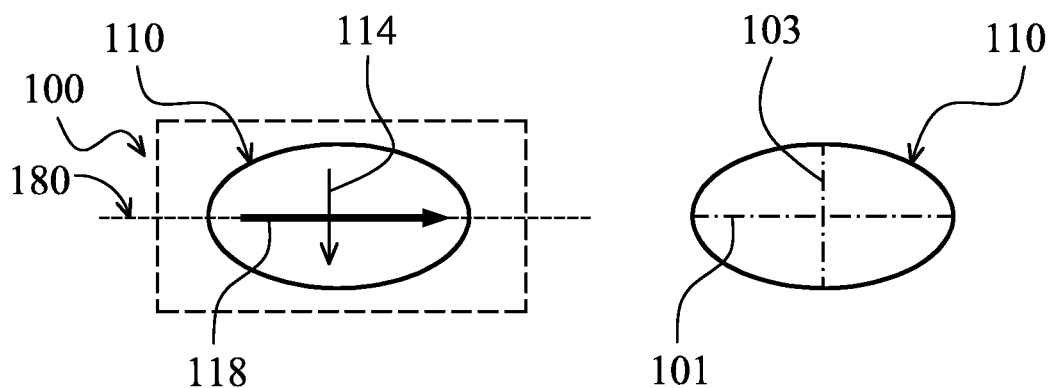
FIG. 1B schematically shows a top view of the typical TMR for a magnetic field sensor in FIG. 1A.
Figure 2A:
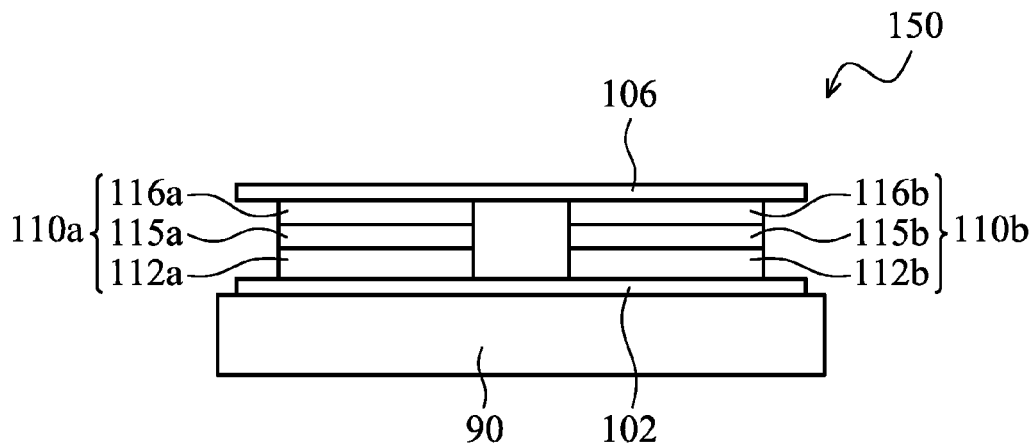
FIGS. 2A~2B are drawings, schematically illustrating the cross-sectional view and the top view along the line at the easy-axis of a mutual supplement tunneling magneto-resistor, called MS-TMR, according to the disclosure of the related art.
Figure 2B:
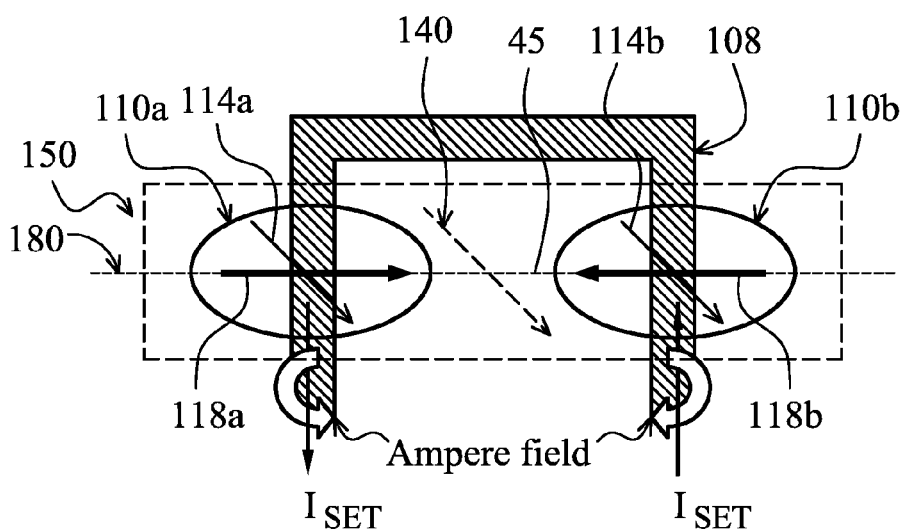

In FIG. 5C, the Z-axis magnetic field sensing unit 309 is a parallel connection of the two magnetic field sensors 150 described in FIG. 2B, comprising MTJ devices N5 to N8. The MTJ devices N5 and N6 have pinned magnetizations parallel to the X-axis, with an angle of 45 degrees to the easy-axis, and free magnetizations parallel to the easy-axis. The MTJ devices N7 and N8 have pinned magnetizations parallel to the Y-axis, with an angle of 45 degrees to the easy-axis, and free magnetizations parallel to the easy-axis.

The TMR reference set 308 in this embodiment is a parallel connection of two TMR reference units (308a, 308b) of the same structure as described in FIG. 3A. The two TMR reference units (308a, 308b) are formed on two inclines 309a and 309b respectively. The two inclines 309a and 309b have the same angle to the plane of the substrate where they are formed and are symmetrically flipped with respect to the medial axle of a groove or a bulge (390) structure on the substrate. The TMR reference unit 308a comprises two MTJ devices M5 and M6, and the TMR reference unit 308b comprises two MTJ devices M7 and M8. The pinned magnetizations of MTJ devices M5 and M6 are parallel to the pinned magnetizations of MTJ devices N5 and N6, and the pinned magnetizations of MTJ devices M7 and M8 are perpendicular to the pinned magnetizations of MTJ devices N7 and N8 respectively. The free magnetizations of MTJ devices M5 to M8 are with an angle of 45 degrees to the free magnetizations of MTJ devices N5 to N8 respectively. A conduction line L3 has four segments respectively disposed below (or above) the MTJ devices M5 to M8 of the TMR reference units 308a and 308b, and the pinned magnetizations of the MTJ devices of the TMR reference units 308a and 308b are parallel to the easy-axes, and the four segments of the conduction line L3 are perpendicular to the pinned magnetizations and the free magnetizations of the MTJ devices M5 to M8 of the TMR reference units 308a and 308b. After applying the ampere field, the free magnetization of the MTJ devices M5 and M7 are anti-parallel to the first pinned magnetization of the MTJ devices M5 and M7, and the free magnetization of the MTJ devices M6 and M8 are parallel to the pinned magnetization of the MTJ devices M6 and M8.

The TMR reference unit (200, 304, 306 or 308) of the present disclosure has a constant conductance (resistance) without introducing additional current. Using the TMR reference unit (200, 304, 306 or 308) as a part of the magnetic field sensing circuit can reduce power consumption, and thus the magnetic field sensing circuit is appropriate for electronic products such as portable devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A magnetic field sensing circuit, comprising:
    a tunneling magneto-resistor (TMR) reference unit as a zero-field reference having a first conductance not responding to an external magnetic field, the TMR reference unit comprising:
    a first MTJ (magnetic tunneling junction) device, having:
    a first pinned layer having a first pinned magnetization at a pinned direction; and
    a first free layer having a first free magnetization parallel to the pinned direction in zero magnetic field; and
    a second MTJ device, having:
        a second pinned layer having a second pinned magnetization at the pinned direction; and
        a second free layer having a second free magnetization anti-parallel to the pinned direction in zero magnetic field,
        wherein the first and second MTJ devices are connected in parallel;
    a magnetic field sensing unit comprising a third MTJ device and a fourth MTJ device connected in parallel, having a second conductance responding to the external magnetic field, wherein a sensing current flows in the magnetic field sensing unit responding to the external magnetic field;
    a current mirror outputting a first current and a second current to the TMR reference unit and the magnetic field sensing unit, wherein the first current is equal to the second current; and
    a signal transfer amplifying unit connected to the magnetic field sensing unit, generating a transfer current in response to a conductance variation of the magnetic field sensing unit when sensing the external magnetic field, wherein the transfer current is equal to the sensing current subtracted by the second current.

2. The tunneling magneto-resistor reference unit as claimed in claim 1, wherein the first and the second pinned magnetizations are along a same direction.

3. The tunneling magneto-resistor reference unit as claimed in claim 1, wherein the first and the second pinned magnetizations are along the major axes of the first and second MTJ devices.

4. The tunneling magneto-resistor reference unit as claimed in claim 1 further comprises a conduction line having two segments disposed below or above the first and second MTJ devices, wherein the two segments of the conduction line are perpendicular to the pinned magnetizations and the free magnetizations of the first and second MTJ devices.

5. The magnetic field sensing circuit as claimed in claim 1, wherein
    easy-axes of the magnetic field sensing unit have angles of 45 degrees to easy-axes of the TMR reference unit;
    the third and the fourth MTJ devices have pinned magnetizations with an angle of 45 degrees to the easy-axes of the magnetic field sensing unit and free magnetizations parallel to the easy-axes of the magnetic field sensing unit;
    the first MTJ device and the second MTJ device have the pinned magnetizations parallel to the easy-axes of the TMR reference unit and the free magnetization of the first MTJ device is anti-parallel to the pinned magnetization of the first MTJ device; and the free magnetization of the second MTJ device is parallel to the pinned magnetization of the second MTJ device.

6. The magnetic field sensing circuit as claimed in claim 5, wherein
    the pinned magnetizations of the first and the second MTJ devices are parallel to the pinned magnetizations of the third and the fourth MTJ devices respectively, the free magnetizations of the first and the second MTJ devices are with an angle of 45 degrees to the free magnetizations of the third and the fourth MTJ devices respectively; and a path of the sensing current is perpendicular to the pinned magnetizations and the free magnetizations of the first and second MTJ devices.

7. The magnetic field sensing circuit as claimed in claim 1, wherein easy-axes of the magnetic field sensing unit with angles of 45 degrees to easy-axes of the TMR reference unit; the third and the fourth MTJ devices have pinned magnetizations with an angle of 45 degrees to the easy-axis of the magnetic field sensing unit and free magnetizations parallel to the easy-axis of the magnetic field sensing unit;

the pinned magnetizations of the first and second MTJ devices are parallel to the easy-axes of the first and second MTJ devices, the free magnetization of the first MTJ device is parallel to the pinned magnetization of the first MTJ device, the free magnetization of the second MTJ device is anti-parallel to the pinned magnetization of the second MTJ device.

8. The magnetic field sensing circuit as claimed in claim 7, wherein the pinned magnetizations of the first and second MTJ devices are parallel to the pinned magnetizations of the third and the fourth MTJ devices respectively, the free magnetizations of the first and the second MTJ devices are with an angle of 45 degrees to the free magnetizations of the third and the fourth MTJ devices respectively; and a path of the sensing current is perpendicular to the pinned magnetizations and the free magnetizations of the first and second MTJ devices.

9. The magnetic field sensing circuit as claimed in claim 1, wherein the magnetic field sensing unit further comprises a fifth and a sixth MTJ devices in a parallel connection with the third and the fourth MTJ devices; wherein the third to the sixth MTJ devices have pinned magnetizations with an angle of 45 degrees to easy-axes and free magnetizations parallel to the easy-axes.

10. The magnetic field sensing circuit as claimed in claim 9, wherein the reference TMR unit further comprises a seventh and a eighth MTJ devices in a parallel connection with the first and the second MTJ devices; wherein the first and the seventh MTJ devices and the second and the eighth MTJ devices are formed on two inclines respectively;

the first, the second, the seventh, and the eighth MTJ devices have pinned magnetizations with an angle of 45 degrees to the easy-axes and free magnetizations parallel to the easy-axes;

the first and the seventh MTJ devices have the free magnetizations that are anti-parallel to the pinned magnetizations of the first and the seventh MTJ devices;

the second and the eighth MTJ devices have the free magnetizations that are parallel to the pinned magnetizations of the first and the seventh MTJ devices;

the pinned magnetizations of the first and the second MTJ devices are parallel to the pinned magnetizations of the third and the fourth MTJ devices;

the pinned magnetizations of the seventh and the eighth MTJ devices are perpendicular to the pinned magnetizations of the fifth and the sixth MTJ devices;

the free magnetizations of the first, the second, the seventh, and the eighth MTJ devices are with an angle of 45 degrees to the free magnetizations of the third to the sixth MTJ devices respectively; and a path of the sensing current is perpendicular to the pinned magnetizations and the free magnetizations of the first, the second, the seventh, and the eighth MTJ devices of the TMR reference unit.

* * * * *